United States Patent
Dai et al.

(10) Patent No.: US 12,213,340 B2
(45) Date of Patent: Jan. 28, 2025

(54) DISPLAY PANEL, DISPLAY APPARATUS AND METHOD FOR MANUFACTURING DISPLAY PANEL

(71) Applicant: WUHAN TIANMA MICROELECTRONICS CO., LTD., Wuhan (CN)

(72) Inventors: Hao Dai, Wuhan (CN); Yangzhao Ma, Wuhan (CN)

(73) Assignee: WUHAN TIANMA MICROELECTRONICS CO., LTD., Wuhan (CN)

(*) Notice: Subject to any disclaimer, the term of this patent is extended or adjusted under 35 U.S.C. 154(b) by 538 days.

(21) Appl. No.: 17/562,850

(22) Filed: Dec. 27, 2021

(65) Prior Publication Data

US 2022/0123058 A1 Apr. 21, 2022

(30) Foreign Application Priority Data

Sep. 13, 2021 (CN) .......................... 202111069159.5

(51) Int. Cl.
| | |
|---|---|
| *H10K 59/121* | (2023.01) |
| *H10K 59/12* | (2023.01) |
| *H10K 59/122* | (2023.01) |
| *H10K 59/65* | (2023.01) |
| *H10K 71/00* | (2023.01) |
| *H10K 102/00* | (2023.01) |

(52) U.S. Cl.
CPC ......... *H10K 59/121* (2023.02); *H10K 59/122* (2023.02); *H10K 59/65* (2023.02); *H10K 71/00* (2023.02); *H10K 59/1201* (2023.02); *H10K 2102/351* (2023.02)

(58) Field of Classification Search
CPC .... H10K 59/121; H10K 59/122; H10K 59/65; H10K 71/00; H10K 59/1201; H10K 2102/351; H10K 59/8723
See application file for complete search history.

(56) References Cited

U.S. PATENT DOCUMENTS

| | | | | |
|---|---|---|---|---|
| 2007/0182322 A1* | 8/2007 | Nagayama | ......... | H10K 59/8722 313/506 |
| 2024/0215419 A1* | 6/2024 | Li | ........................ | H10K 50/115 |

FOREIGN PATENT DOCUMENTS

| | | |
|---|---|---|
| CN | 205787495 U | 12/2016 |
| CN | 112186001 A | 1/2021 |

* cited by examiner

*Primary Examiner* — Julia Slutsker
(74) *Attorney, Agent, or Firm* — CHRISTENSEN O'CONNOR JOHNSON KINDNESS PLLC

(57) ABSTRACT

A display panel, a display apparatus and a method for manufacturing the display panel are provided. The display panel has a first display region and an optical component region. The first display region surrounds at least a part of the optical component region. The optical component region includes a pixel region and a non-pixel region. The display panel includes a first electrode and a first light-emitting module that are located in the pixel region, and at least one second electrode and a first support member that are located in the non-pixel region. One first electrode covers the first light-emitting module along a thickness direction of the display panel. One second electrode is bridged between two adjacent first electrodes. The first support member overlaps with one of the at least one second electrode along the thickness direction of the display panel.

19 Claims, 14 Drawing Sheets

DISPLAY PANEL, DISPLAY APPARATUS AND METHOD FOR MANUFACTURING DISPLAY PANEL

CROSS-REFERENCE TO RELATED APPLICATIONS

The present application claims priority to Chinese Patent Application No. 202111069159.5, filed on Sep. 13, 2021, the content of which is incorporated herein by reference in its entirety.

TECHNICAL FIELD

The present disclosure relates to the field of display technologies, and, particularly, relates to a display panel, a display apparatus, and a method for manufacturing the display panel.

BACKGROUND

With increased consumer demand for displays, full-screen displays have become a focus of research. Conventionally, in order to realize full-screen display, it is important to integrate functional components, such as a camera, an infrared sensor, and a face recognition component under a display screen, which put forward higher requirements for the transmittance of the display screen.

In processes for manufacturing an organic light-emitting diode (OLED) display panel, a cathode of the OLED device has a great influence on the transmittance of the display screen. Conventionally, the cathode of the OLED device is generally patterned to increase the transmittance of the display screen. In a cathode patterning process, other functional layers can be scratched, thereby reducing the yield of the OLED display panel.

SUMMARY

In a first aspect of the present disclosure, a display panel is provided. The display panel has a first display region and an optical component region. The first display region surrounds at least a part of the first display region, and the optical component region includes a pixel region and a non-pixel region. The display panel includes a substrate, at least one first light-emitting module located in the pixel region, first electrodes, at least one second electrode located in the non-pixel region, and a first support member located in the non-pixel region. One of the first electrodes is located in the pixel region and covers the at least one first light-emitting module along a thickness direction of the display panel. One of the at least one second electrode is bridged between two adjacent first electrodes of the first electrodes. One of the at least one second electrode is located at a side of the first support member facing away from the substrate, and the first support member overlaps with the second electrode along the thickness direction of the display panel.

In a second aspect of the present disclosure, a display apparatus is provided. The display apparatus includes a display panel and an optical function element. The display panel has a first display region and an optical component region. The first display region surrounds at least a part of the first display region, and the optical component region includes a pixel region and a non-pixel region. The optical function element is provided at a position of the display apparatus corresponding to the optical component region. The display panel includes a substrate, at least one first light-emitting module located in the pixel region, first electrodes, at least one second electrode located in the non-pixel region, and a first support member located in the non-pixel region. One of the first electrodes is located in the pixel region and covers the at least one first light-emitting module along a thickness direction of the display panel. One of the at least one second electrode is bridged between two adjacent first electrodes of the first electrodes. One of the at least one second electrode is located at a side of the first support member facing away from the substrate, and the first support member overlaps with the second electrode along the thickness direction of the display panel.

In a third aspect of the present disclosure, a method for manufacturing a display panel is provided. The display panel includes a first display region and an optical component region, and the optical component region includes a pixel region and a non-pixel region. The method includes: providing a substrate; manufacturing at least one first light-emitting module, wherein the first light-emitting module is located at a side of the substrate and located in the pixel region; manufacturing a first support member, wherein the first support member is located at a side of the substrate and located in the non-pixel region; preparing first electrodes, wherein the first electrodes cover the pixel region, and one of the first electrodes is located at a side of one of the at least one first light-emitting module facing away from the substrate; and preparing at least one second electrode, wherein the at least one second electrode is located in the non-pixel region and located at a side of the first support member facing away from the substrate. One of the at least one second electrode is bridged between two adjacent first electrodes of the first electrodes, and the first support member overlaps with one of the at least one second electrode along a thickness direction of the display panel.

In the present disclosure, a plurality of first electrodes in the optical component region is electrically connected to each other through the second electrodes, so that the cathode in the optical component region corresponding to the first light-emitting module is patterned, thereby improving the transmittance of the optical component region. It can be understood that both of the first electrode and the second electrode can be prepared by an evaporation process. When the cathode corresponding to the first light-emitting module is patterned, two masks are used. The preparation of the first electrode utilizes the first mask. The first mask includes a hollow part and a shielding part. The first electrode is formed by depositing the evaporation material in the hollow part of the first mask. That is, during the preparation process of the first electrode, the hollow part of the first mask corresponds to the region where the first electrode is located, and the shielding part corresponds to the non-pixel region where the first electrode is not provided. In the preparation process of the display panel, when the first mask is used to prepare the first electrode, the first support member supports the shielding part of the first mask, so that the first mask is prevented from contacting with the prepared layers (except the second electrode) of the display panel, thereby preventing the first mask from scratching the main functional layers (for example, the layer other than the second electrode) of the display panel.

BRIEF DESCRIPTION OF DRAWINGS

In order to more clearly explain the embodiments of the present disclosure or the technical solution in the related art, the drawings used in the description of the embodiments or the related art will be briefly described below. The drawings in the following description are some embodiments of the present disclosure. Those skilled in the art can obtain other drawings based on these drawings.

DESCRIPTION OF EMBODIMENTS

In order to better understand technical solutions of the present disclosure, the embodiments of the present disclosure are described in detail with reference to the drawings.

It should be clear that the described embodiments are merely part of the embodiments of the present disclosure rather than all of the embodiments. It is obvious for those skilled in the art that various modifications and changes can be made in the present disclosure without departing from the spirit or scope of the present disclosure. Therefore, the present disclosure intends to cover the amendments and changes of the present disclosure that fall within the scope of the corresponding claims (claimed technical solutions) and their equivalents. It should be noted that the embodiments provided by the present disclosure can be combined with each other if there is no contradiction. The terms used in the embodiments of the present disclosure are merely for the purpose of describing specific embodiment, rather than limiting the present disclosure. The terms "a", "an", "the" and "said" in a singular form in an embodiment of the present disclosure and the attached claims are also intended to include plural forms thereof, unless noted otherwise.

It should be understood that the term "and/or" used in the context of the present disclosure is to describe a correlation relation of related objects, indicating that there can be three relations, e.g., A and/or B can indicate only A, both A and B, and only B. In addition, the symbol "/" in the context generally indicates that the relation between the objects in front and at the back of "/" is an "or" relationship.

For this specification, it should be understood that the terms "basically", "approximately", "about", "generally" and "substantially" described in claims and embodiments of the present disclosure refer to a substantially approved value, rather than an exact value, within a reasonable process operation range or tolerance range.

It should be understood that although the terms "first" and "second" can be used in the present disclosure to describe electrodes, support members and surfaces which should not be limited to these terms. These terms are used only to distinguish the electrodes, support members and surfaces from each other. For example, without departing from the scope of the embodiments of the present disclosure, a first electrode can also be referred to as a second electrode. Similarly, the second electrode can also be referred to as the first electrode.

Figure 1:
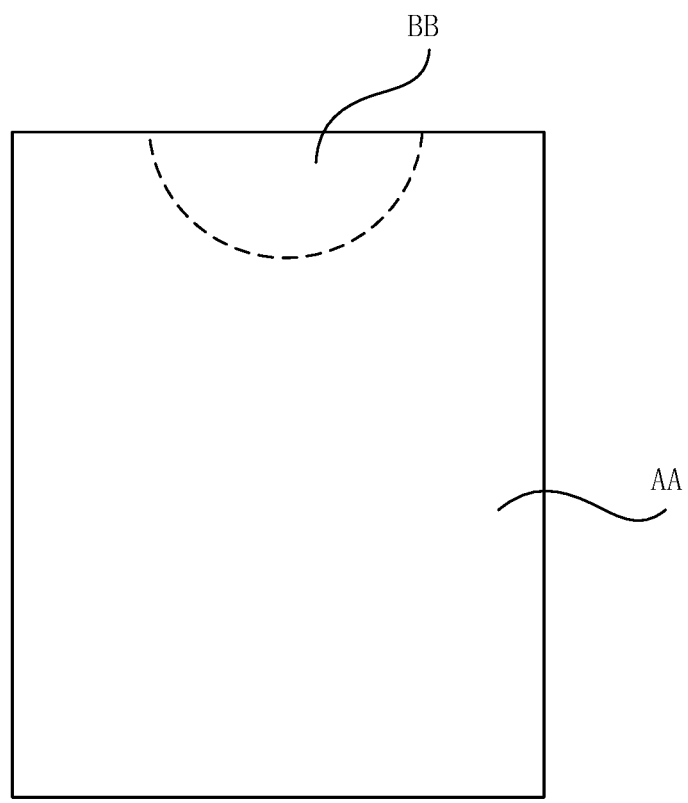
FIG. 1 is a schematic diagram showing a display panel according to an embodiment of the present disclosure.
Figure 2:
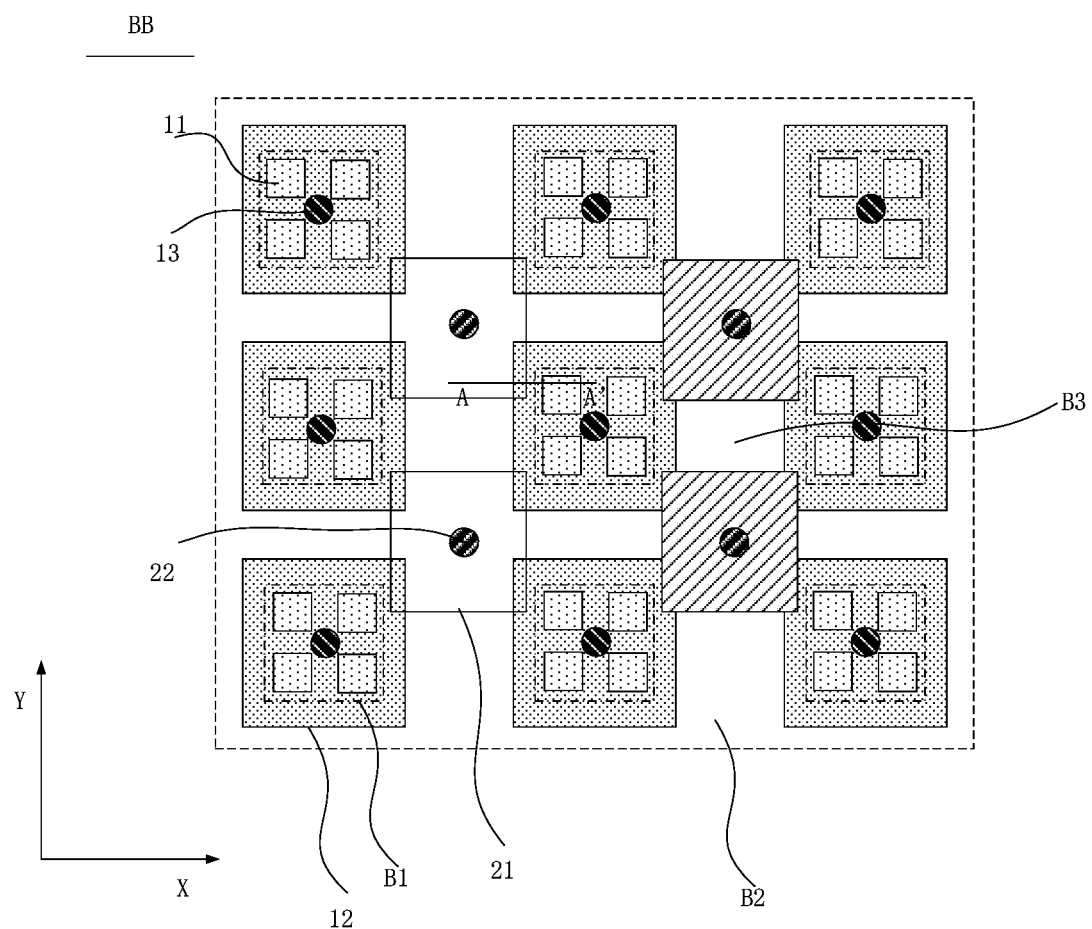
FIG. 2 is an enlarged view of a BB region shown in FIG. 1 according to an embodiment of the present disclosure.
Figure 3:
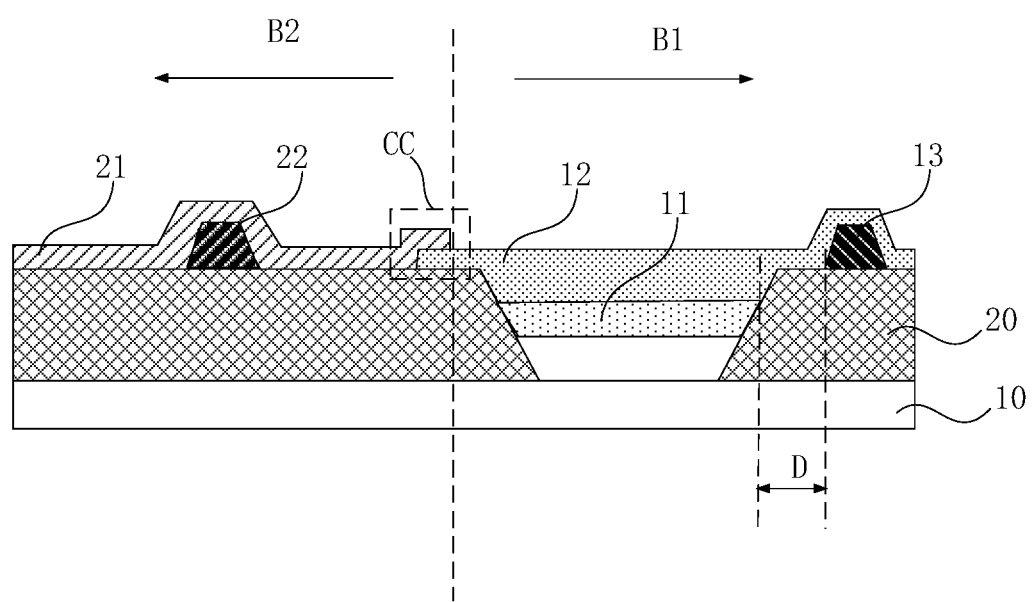
FIG. 3 is a cross-sectional view along line A-A' shown in FIG. 2 according to an embodiment of the present disclosure.

FIG. 1 is a schematic diagram showing a display panel according to an embodiment of the present disclosure, FIG. 2 is an enlarged view of a BB region shown in FIG. 1 according to an embodiment of the present disclosure, and FIG. 3 is a cross-sectional view along line A-A' shown in FIG. 2 according to an embodiment of the present disclosure.

The problem of scratching a functional layer is analyzed, and it is found that in order to pattern the cathode, two masks are generally used. When two masks are used to realize patterning of the cathode, the mask cannot be effectively supported by spacers at some positions, which results that the mask scratches the functional layer, thereby reducing the yield of the OLED display panel.

As shown in FIG. 1, the present disclosure provides a display panel 01. The display panel 01 includes a first display region AA and an optical component region BB. The first display region AA surrounds at least a part of the optical component region BB. That is, the optical component region BB can be completely surrounded by the first display region AA, or, as shown in FIG. 1, the optical component region BB can be partially surrounded by the first display region AA. Referring to FIG. 2 and FIG. 3, the display panel 01 further includes a substrate 10. The optical component region BB includes a pixel region B1 and a non-pixel region B2. A first light-emitting module 11 and a first electrode 12 are provided in the pixel region B1. It can be understood that the first light-emitting module 11 is a module for displaying images and emitting light and can include at least one of a red luminescent material, a green luminescent material and a blue luminescent material. The first electrode 12 covers the first light-emitting module 11 along a thickness direction of the display panel 01. A part of the first electrode 12 covering the first light-emitting module 11 can be a cathode corresponding to the first light-emitting module 11. A second electrode 21 and a first support member 22 are provided in the non-pixel region B2. The second electrode 21 is bridged between two adjacent first electrodes 12, i.e., two adjacent first electrodes 12 are electrically connected via the second electrode 21.

The pixel region B1 is a display region which is mainly used for display images, and the non-pixel region B2 is a non-display region which is mainly used for transmitting light except for providing signal lines.

The second electrode 21 is located at a side of the first support member 22 facing away from the substrate 10, and the first support member 22 overlaps with the second electrode 21 along the thickness direction of the display panel 01. When a first mask is used to prepare the first electrode 12, the first support member 22 can be configured to support the first mask.

In an embodiment of the present disclosure, a plurality of first electrodes 12 in the optical component region BB are electrically connected by the second electrodes 21, so that the cathodes corresponding to the first light-emitting module 11 in the optical component region BB are patterned, thereby improving the transmittance of the optical component region BB. Since the second electrode 21 is located in the non-pixel region B2, it can be understood that the second electrode 21 is only used as a connection electrode, for example, the first electrodes 12 of the pixel region B1 are connected in a grid pattern. While increasing the transmittance of the optical component region BB, the grid distribution of the cathode voltage of the optical component region BB is achieved. The grid distribution of the cathode voltage can reduce the time of receiving the cathode voltage by the first light-emitting module 11, and reduce the voltage drop of the cathode, so that the loading time of the optical component region BB for display an image is effectively reduced.

It shall be understood that the preparation processes of the first electrode 12 and the second electrode 21 can both be evaporation processes. When patterning the cathode corresponding to the first light-emitting module 11, two masks are used.

A first mask is used to prepare the first electrode 12. The first mask includes a hollow part and a shielding part. The first electrode 12 is formed when an evaporation material is deposited in the hollow part of the first mask. That is, during the preparation process of the first electrode 12, the hollow part of the first mask corresponds to the region where the first electrode 12 is located, and the shielding part corresponds to the non-pixel region B2 where the first electrode 12 is not provided. In the preparation process of the display panel 01, when the first mask is used to prepare the first electrode 12, the first support member 22 can support the shielding part of the first mask, so that the first mask is prevented from contacting with the prepared layers (except for the second electrode) of the display panel 01, thereby preventing the first mask from scratching main functional layers (e.g., the layers other than the second electrode) of the display panel 01.

Referring to FIG. 3, in an embodiment of the present disclosure, a second support member 13 is provided in the pixel region B1. The first electrode 12 is located at a side of the second support member 13 facing away from the substrate 10 and overlaps with the second support member 13 along the thickness direction of a display panel 01. When the second mask is used to prepare the second electrode 21, the second support member 13 can be used to support the second mask.

A second mask is used to prepare the second electrode 21. The second mask includes a hollow part and a shielding part. The second electrode 21 is formed when an evaporation material is deposited in the hollow part of the second mask. That is, during the preparation process of the second electrode 21, the hollow part of the second mask corresponds to the region where the second electrode 21 is located, and the shielding part corresponds to the region where the second electrode 21 is not provided.

When the second mask is used to prepare the second electrode 21, the second support member 13 can support the shielding part of the second mask, so that the second mask is prevented from contacting with the prepared layer in the display panel 01, thereby preventing the second mask from scratching the main functional layers of the display panel 01. Since the first support member 22 overlaps with the second electrode 21, and the second support member 13 overlaps with the first electrode 12 along the thickness direction of the display panel 01, the mask can be well supported by the first support member 22 or the second support member 13 to prevent the mask from scratching the main functional layers of the display panel 01 in the process for patterning the cathode corresponding to the first light-emitting module 11, even if there is a misalignment between the mask and the display panel 01. Meanwhile, the second support member 13 can be provided to prevent the second mask from scratching the main part (the region where the second support member is not located) of the first electrode 12, and the first support member 22 can be provided to prevent the first mask from scratching the main part (the region where the first support member is not located) of the second electrode 21, thereby effectively improving the yield of the display panel 01.

Figure 4:
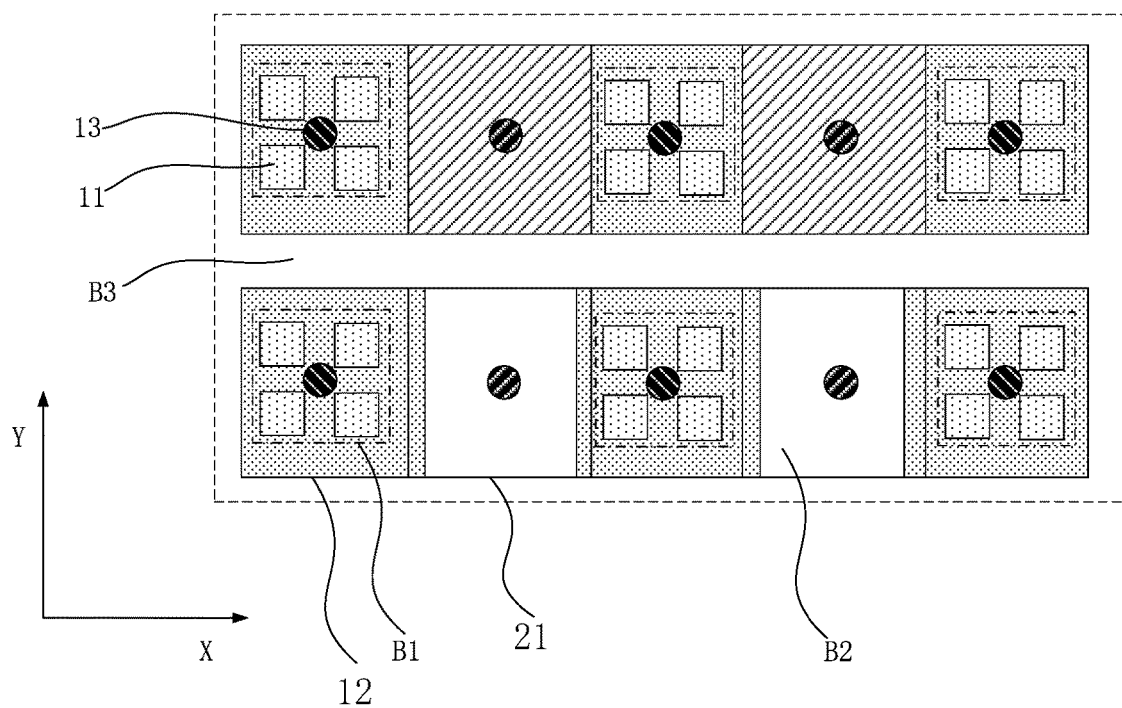
FIG. 4 is a schematic diagram showing an optical component region according to an embodiment of the present disclosure.

FIG. 4 is a schematic diagram showing an optical component region according to an embodiment of the present disclosure.

In an embodiment of the present disclosure, the first electrodes 12 are arranged along a first direction X and along a second direction Y. The first direction X intersects with the second direction Y. The second electrode 21 is bridged between two adjacent first electrodes 12 arranged along the first direction X.

In an embodiment of the present disclosure, as shown in FIG. 4, the second electrode 21 is bridged between two adjacent first electrodes 12 arranged along the first direction X, but is not bridged between two adjacent first electrodes 12 arranged along the second direction Y. While realizing the patterning of the cathode in the optical component region BB, the alignment accuracy is improved when the first electrode 12 and the second electrode 21 are prepared by the mask, thereby reducing the process difficulty. Meanwhile, the continuous area of the region that is not covered by the first electrode 12 and the second electrode 21 are increased, so that the diffraction effect is reduced, thereby improving the transmittance.

In another embodiment of the present disclosure, as shown in FIG. 2, the second electrode 21 bridges between two adjacent first electrodes 12 arranged along the first direction X, and the second electrode 21 bridges between two adjacent first electrodes 12 arranged along the second direction Y. While realizing the patterning of the cathode in the optical component region BB, it is beneficial to reduce the number of the second electrodes 21 and further increase the transmittance of the optical component region BB.

Referring to FIG. 2, in an embodiment of the present disclosure, the optical component region BB includes a plurality of first light-transmitting regions B3 which is surrounded by the first electrode 12 and the second electrode 21. That is, neither the first electrode 12 nor the second electrode 21 covers the first light-transmitting region B3 along the thickness direction of the display panel 01, so that the optical component region BB includes an area where no electrode is provided, thereby improving the transmittance of the optical component region BB.

In an embodiment of the present disclosure, the second electrode 21 has a transmittance greater than a transmittance of the first electrode 12. Since the second electrode 21 is located in the non-pixel region, i.e., the second electrode 21 does not cover the light-emitting element, the region of the second electrode 21 can be used as a light-transmitting region. The transmittance of the second electrode 21 is relatively large, so that the transmittance of the optical component region BB can be increased. The first electrode 12 and the second electrode 21 can be made of a same or different material. For example, the first electrode 12 and the second electrode 21 are both made of a light-transmitting material. In an embodiment, the first electrode 12 is a metal material, and the second electrode 21 is a light-transmitting material.

In an embodiment of the present disclosure, when the display panel 01 is of a bottom emission type, the first electrode 12 can be made of a metal material, and the second electrode 21 can be made of a light-transmitting material. Since the first electrode 12 covers the first light-emitting module 11, the metal material can reflect the light emitted from the first light-emitting module 11, thereby stabilizing the display brightness of the display panel 01. The second electrode 21 is located in the non-pixel region. The light-transmitting material can increase the transmittance of the optical component region BB.

Figure 5:
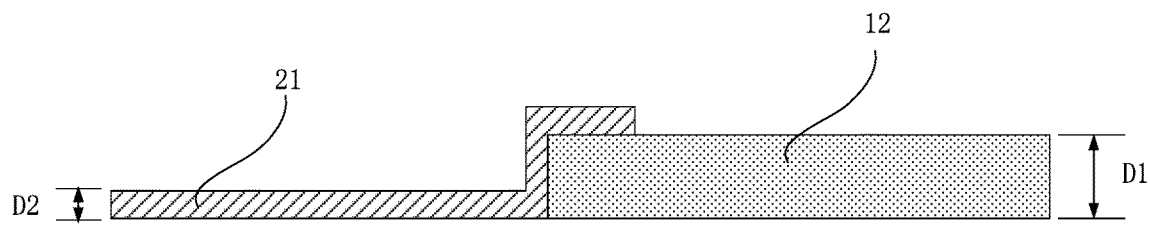
FIG. 5 is a cross-sectional view of a first electrode and a second electrode according to an embodiment of the present disclosure.

FIG. 5 is a cross-sectional view of a first electrode and a second electrode according to an embodiment of the present disclosure.

As shown in FIG. 5, in an embodiment of the present disclosure, the first electrode 12 and the second electrode 21 are both made of light-transmitting materials. Along the thickness direction of the display panel 01, a thickness D2 of the second electrode 21 is smaller than a thickness D1 of the first electrode 12, so that the second electrode 21 has a transmittance greater than a transmittance of the first electrode 12, thereby increasing the transmittance of the optical component region BB. The first electrode 12 and the second electrode 21 are made of a same material or different materials.

Figure 6:
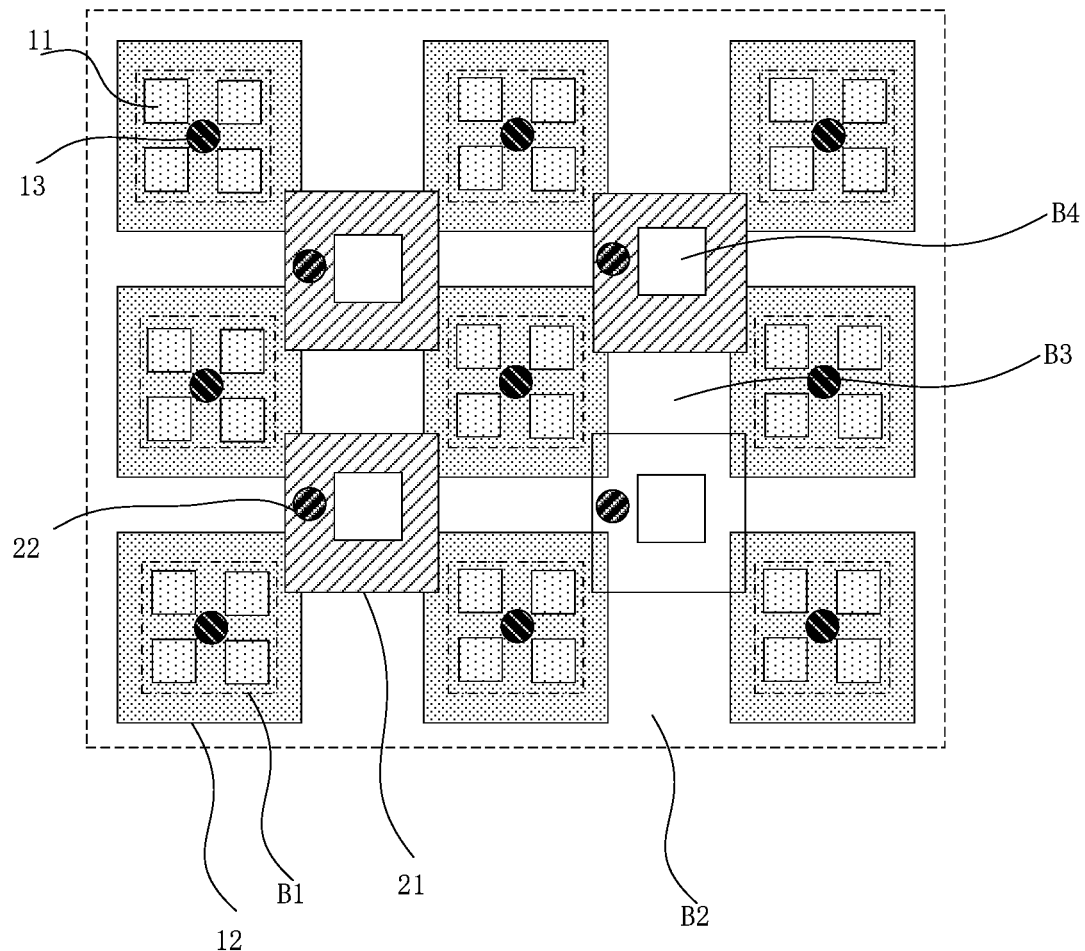
FIG. 6 is another schematic diagram showing an optical component region according to an embodiment of the present disclosure.

FIG. 6 is another schematic diagram showing an optical component region according to an embodiment of the present disclosure.

In an embodiment of the present disclosure, as shown in FIG. 6, the optical component region BB includes a plurality of second light-transmitting regions B4. Along the thickness direction of the display panel 01, the second electrode 21 overlaps with the second light-transmitting region B4. It can be understood that the second electrode 21 is provided with a hollow part to form the second light-transmitting region B4, and the second light-transmitting region B4 is surrounded by the second electrode 21, increasing the transmittance of the optical component region BB.

In an embodiment of the present disclosure, as shown in FIG. 3, the display panel 01 includes a pixel definition layer 20. The first support member 22 is located at a side of the pixel definition layer 20 facing away from the substrate 10. The first support member 22 can be integrated with the pixel definition layer 20. The second support member 13 can also be located at a side of the pixel definition layer 20 facing away from the substrate 10. The second support member 13 can also be integrated with the pixel definition layer 20. That is, the first support member 22 and the second support member 13 can both be located at a side of the pixel definition layer 20 facing away from the substrate 10. Each of the first support member 22 and the second support member 13 can be manufactured with the pixel definition layer 20.

In the present disclosure, the first support member 22 and the second support member 13 are formed into one piece with the pixel definition layer 20, so that the manufacturing process is effectively simplified, thereby saving costs. The first support member and second support member in the present disclosure can also be respectively formed with the pixel definition layer in different steps, rather than being formed into one piece, so as to increase the flexibility of the design of the support member and the pixel definition layer.

Referring to FIG. 3, in an embodiment of the present disclosure, along the thickness direction of the display panel 01, the second electrode 21 and the first electrode 12 adjacent to the second electrode 21 overlap with each other in a first overlapping region CC, so that the reliability of the electrical connection between the second electrode 21 and the first electrode 12 adjacent to the second electrode 21 is effectively achieved, thereby avoiding poor contact of the patterned cathode. In an embodiment of the present disclosure, one of the first electrode and the second electrode, which is closer to the substrate, is provided with one or more bottomed/bottomless grooves in the first overlapping region CC so as to increase the stability of the connection between them, thereby improving electrical connection performance.

The first overlapping region CC does not overlap with the first light-emitting module 11. That is, along the thickness direction of the display panel 01, the first overlapping region CC does not cover the first light-emitting module 11, so that the first overlapping region CC does not shield the light emitted by the first light-emitting module 11, thereby avoiding affecting the brightness of the optical component region BB.

Figure 7:
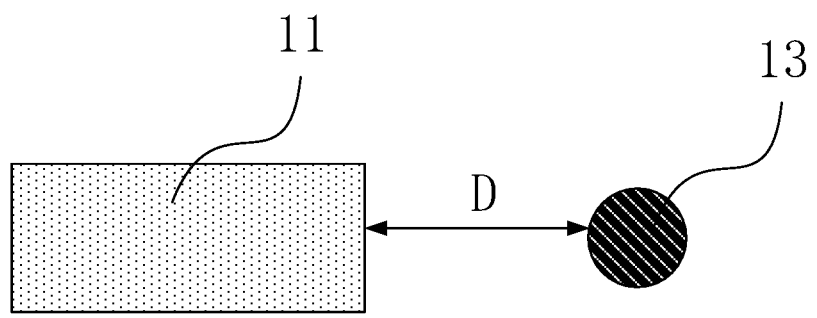
FIG. 7 is a schematic diagram showing projection positions of a first light-emitting module and a second support member according to an embodiment of the present disclosure.

FIG. 7 is a schematic diagram showing projection positions of a first light-emitting module and a second support member according to an embodiment of the present disclosure.

In an embodiment of the present disclosure, as shown in FIG. 3 and FIG. 7, along the thickness direction of the display panel 01, a minimum distance D between a projection of the second support member 13 and a projection of the adjacent first light-emitting module 11 is greater than or equal to 3 μm, i.e., D≥3 μm. That is, the second support member 13 does not overlap with its adjacent first light-emitting module 11 along the thickness direction of the display panel 01.

In the present disclosure, since the second support member 13 does not overlap with the first light-emitting module 11, the second support member 13 cannot shield the light emitted from the first light-emitting module 11, thereby avoiding affecting the brightness of the optical component region BB. When the first electrode 12 is prepared, the first electrode 12 covers the second support member 13 and the first light-emitting module 11 adjacent to the second support member 13. Along the thickness direction of the display panel 01, the minimum distance between a projection of the second support member 13 and a projection of the first light-emitting module 11 is not less than 3 µm, so that the first electrode 12 can completely cover the first light-emitting module 11, thereby avoiding fracture of first electrode 12.

Figure 8:
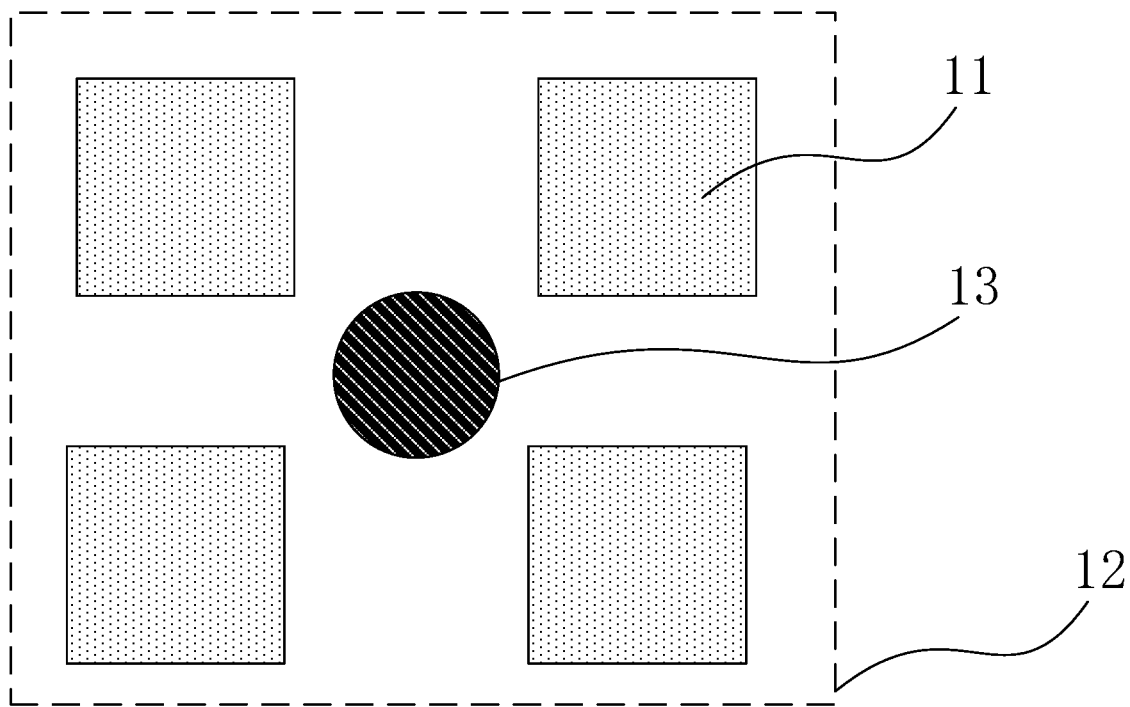
FIG. 8 is a schematic diagram showing projection positions of a first light-emitting module and a second support member according to another embodiment of the present disclosure.
Figure 9:
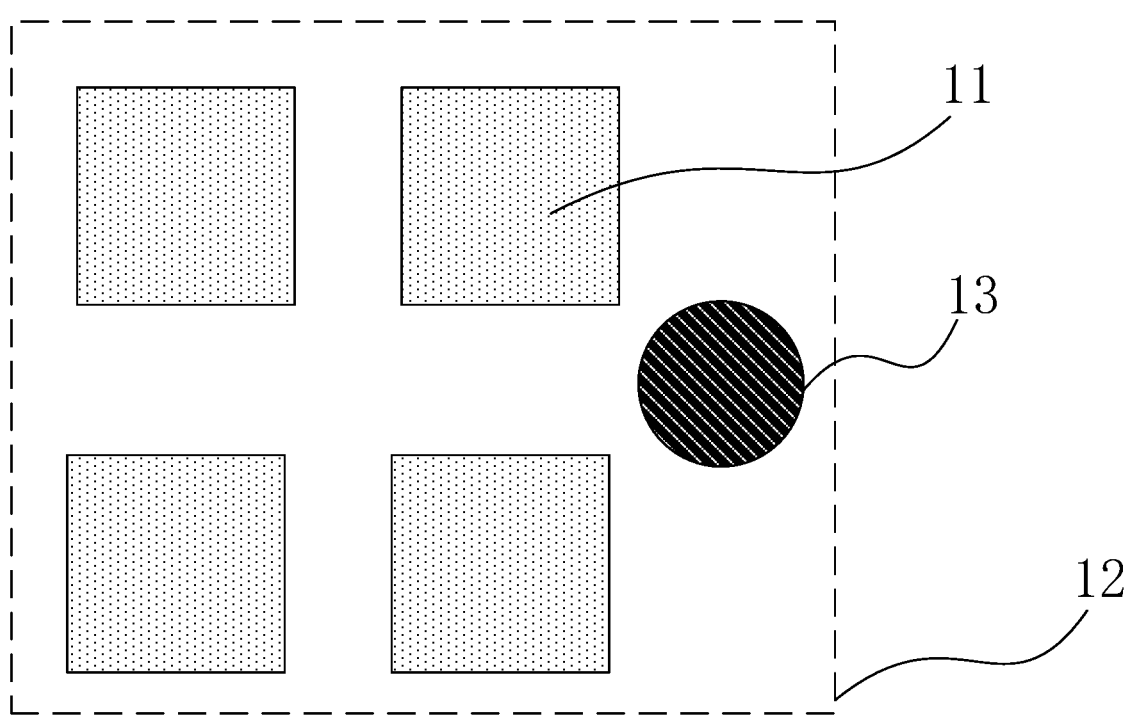
FIG. 9 is another schematic diagram showing projection positions of a first light-emitting module and a second support member according to an embodiment of the present disclosure.

FIG. 8 is a schematic diagram showing projection positions of a first light-emitting module and a second support member according to another embodiment of the present disclosure, and FIG. 9 is another schematic diagram showing projection positions of a first light-emitting module and a second support member according to an embodiment of the present disclosure.

In an embodiment according to the present disclosure, as shown in FIG. 8, for a plurality of first light-emitting modules 11 and the second support member 13 that are covered by a same first electrode 12, the second support member 13 is surrounded by a plurality of first light-emitting modules 11 along the thickness direction of the display panel 01. That is, when the first electrode 12 covers the second support member 13 and the plurality of first light-emitting modules 11, the second support member 13 is located at a center of the plurality of first light-emitting modules 11. In an embodiment of the present disclosure, it can be understood that along the thickness direction of the display panel 01, the second support member 13 does not overlap with the first light-emitting module 11, the second support member 13 cannot cover the first light-emitting module 11, to avoid affecting the brightness of the optical component region BB. Meanwhile, since the second support member 13 is located at a center of the plurality of first light-emitting modules 11, it is also beneficial to improve the alignment accuracy of the second support plate. As shown in FIG. 9, the second support member 13 can also be located at the periphery of the plurality of first light-emitting modules 11. It can be understood that, along the thickness direction of the display panel 01, the minimum distance between the projection of the second support member 13 and the projection of the adjacent first light-emitting module 11 is not less than 3 µm. The second support member 13 is located at the periphery of the plurality of first light-emitting modules 11, so that the first electrode 12 can completely cover the first light-emitting module, thereby achieving normal light emission of the first light-emitting module 11.

Figure 10:
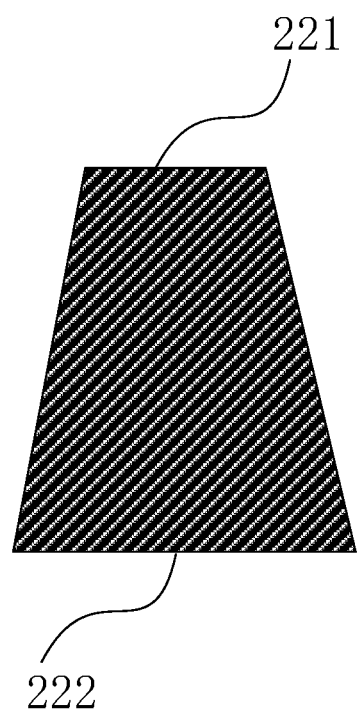
FIG. 10 is a cross-sectional view of a first support member according to an embodiment of the present disclosure.
Figure 11:
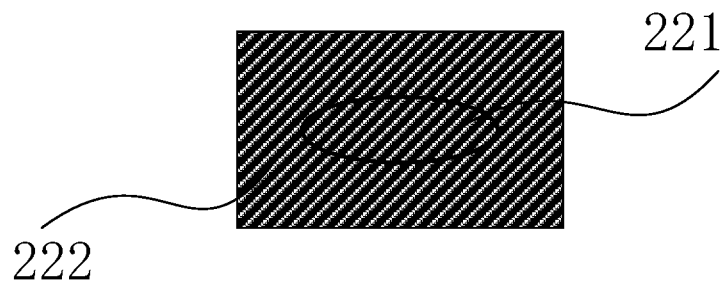
FIG. 11 is a schematic diagram showing a projection of a first support member according to an embodiment of the present disclosure.
Figure 12:
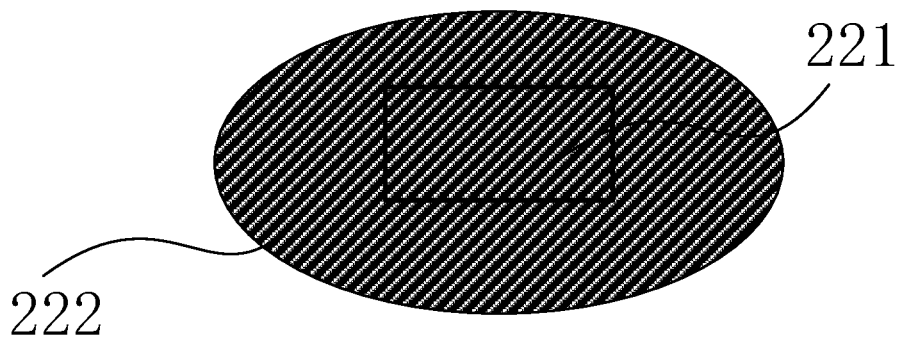
FIG. 12 is another schematic diagram showing a projection of a first support member according to an embodiment of the present disclosure.
Figure 13:
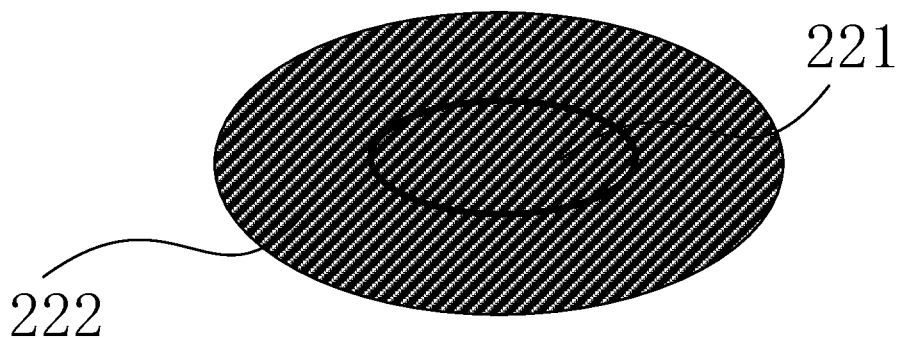
FIG. 13 is a schematic diagram showing a projection of a first support member according to another embodiment of the present disclosure.

FIG. 10 is a cross-sectional view of a first support member according to an embodiment of the present disclosure; FIG. 11 is a schematic diagram showing a projection of a first support member according to an embodiment of the present disclosure; FIG. 12 is another schematic diagram showing a projection of a first support member according to an embodiment of the present disclosure; and FIG. 13 is a schematic diagram showing a projection of a first support member according to another embodiment of the present disclosure.

In an embodiment of the present disclosure, the first support member 22 is made of a light-transmitting material. That is, the first support member 22 is non-opaque. As shown in FIG. 10, along the thickness direction of the display panel 01, the first support member 22 includes a first surface 221 and a second surface 222. A contour of the projection of the first surface 221 includes arc segments, and/or, a contour of the projection of the second surface includes arc segments. That is, a contour of the projection of at least one of the first surface 221 and the second surface 222 includes an arc segment, i.e., a contour of the projection of the first support member 22 along the thickness direction of the display panel 01 includes an arc segment. In an embodiment of the present disclosure, the projection of the first support member 22 includes arc segments, so that the effect of superimposed diffraction of light in the same direction can be effectively reduced, thereby effectively reducing the undesirable optical effect such as the diffraction caused by the first support member 22.

In an embodiment of the present disclosure, as shown in FIG. 11, along the thickness direction of the display panel 01, the contour of the projection of the first surface 221 of the first support member 22 includes arc segments, and the contour of the projection of the second surface 222 does not include arc segments.

In an embodiment of the present disclosure, as shown in FIG. 12, along the thickness direction of the display panel 01, the contour of the projection of the second surface 222 of the first support member 22 includes arc segments, and the contour of the projection of the first surface 221 of the first support member 22 does not include arc segments.

In an embodiment of the present disclosure, as shown in FIG. 13, along the thickness direction of the display panel 01, the contour of the projection of the first surface 221 of the first support member 22 includes arc segments, and the contour of the projection of the second surface 222 of the first support member 22 includes arc segments.

In an embodiment of the present disclosure, along the thickness direction of the display panel 01, the projection of the first surface 221 has a circular or elliptical shape, and/or the projection of the second surface 222 has a circular or elliptical shape.

For example, as shown in FIG. 13, the projection of the first surface 221 has an elliptical shape, and the projection of the second surface 222 has an elliptical shape. For another example, the projection of the first surface 221 has a circular shape, and the projection of the second surface 222 has a circular shape. In another example, the projection of the first surface 221 has a circular shape, and the projection of the second surface 222 has an elliptical shape. In another example, the projection of the first surface 221 has an elliptical shape, and the projection of the second surface 222 has a circular shape. The present disclosure reduces the undesirable effects such as the superposition of diffraction in the same direction generated by the first support member 22, thereby reducing the influence of diffraction on the working effect of the optical component corresponding to the optical component region BB.

In an embodiment of the present disclosure, a contour of the projection of the first surface 221 along the thickness direction of the display panel 01 has a different shape from a contour of the projection of the second surface 222 along the thickness direction of the display panel 01. The present disclosure further reduces undesirable effects, such as the superposition of diffraction in the same direction generated by the first support member 22, thereby reducing the influence of diffraction on the working effect of the optical component corresponding to the optical component region BB.

Figure 14:
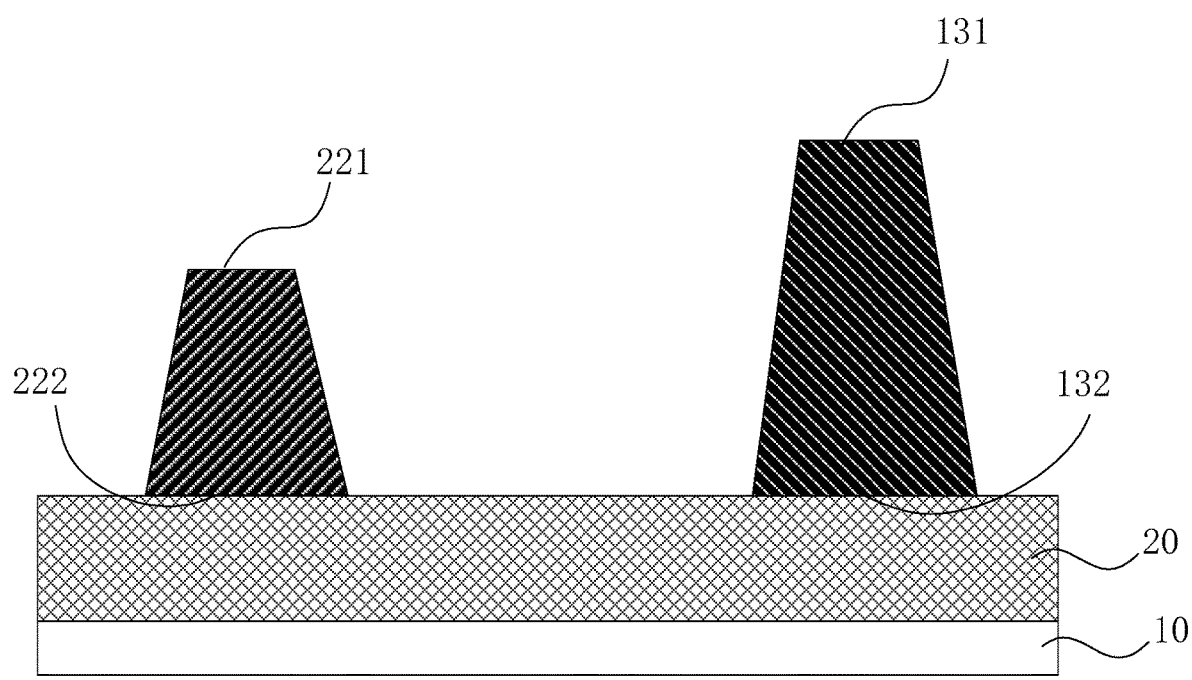
FIG. 14 is a cross-sectional view of a support member according to an embodiment of the present disclosure.
Figure 15:
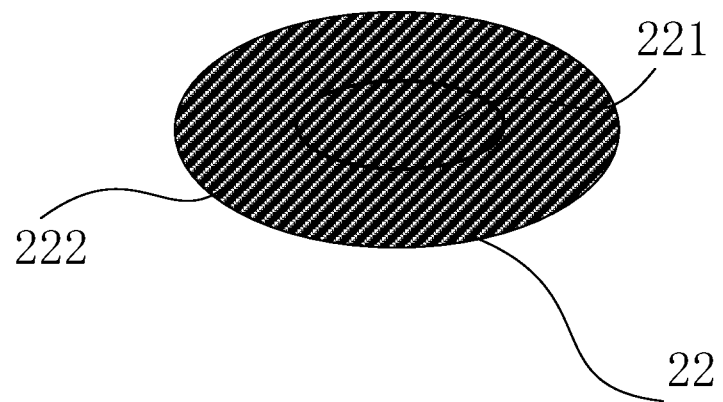
FIG. 15 is a schematic diagram showing projections of a first support member and a second support member according to an embodiment of the present disclosure.
Figure 15:
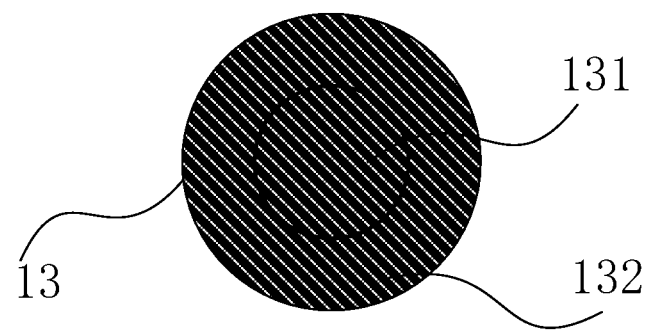

FIG. 14 is a cross-sectional view of a support member according to an embodiment of the present disclosure. FIG. 15 is a schematic diagram showing projections of a first support member and a second support member according to an embodiment of the present disclosure.

In an embodiment of the present disclosure, referring to FIG. 14 and FIG. 15, the first support member 22 includes a first surface 221 and a second surface 222 that are arranged in sequence along the thickness direction of the display panel 01. The second surface 222 is located between the first surface 221 and the substrate 10. The second support member 13 includes a third surface 131 and a fourth surface 132 that are arranged in sequence along the thickness direction of the display panel 01. The fourth surface 132 is located between the third surface 131 and the substrate 10.

The contour of the projection of the first surface 221 in the thickness direction of the display panel 01 has a different shape from the contour of the projection of the third surface 131 in the thickness direction of the display panel 01, and/or the contour of the projection of the second surface 222 in the thickness direction of the display panel 01 has a different shape from the contour of the projection of the fourth surface 132 along the thickness direction of the display panel 01. It can be understood that the first support member 22 has a different shape from the second support member 13.

In an embodiment of the present disclosure, the first support member 22 and the second support member 13 are designed to be differentiated, so that the undesirable effect of diffraction of the first support member 22 can be reduced, thereby reducing the influence of diffraction produced by the first support member 22 on the working effect of the optical component corresponding to the optical component region BB.

Figure 16:
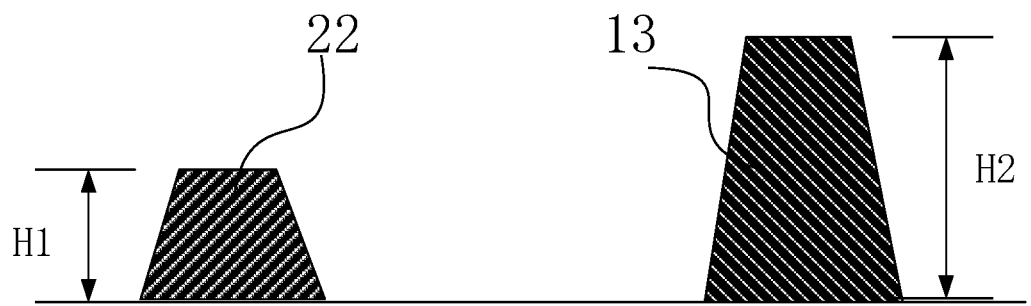
FIG. 16 is a cross-sectional view showing a first support member and a second support member according to an embodiment of the present disclosure.

FIG. 16 is a cross-sectional view showing a first support member and a second support member according to an embodiment of the present disclosure.

In an embodiment of the present disclosure, as shown in FIG. 16, the first support member 22 has a height H1, and the second support member 13 has a height H2, where H1<H2. That is, the height of the second support member 13 in the pixel region B1 is greater than the height of the first support member 22 in the non-pixel region B2. It can be understood that when the first mask is used to prepare the first electrode 12, the first support member 22 supports the first mask. The height of the first support member 22 is configured to be small, so that the height between the first mask and the prepared layer of the display panel 01, thereby reducing the possibility of the evaporation material entering the position between the shielding part of the first mask and the prepared layer of the display panel 01, and effectively reducing the shadow effect of the pixel region B1. Meanwhile, if the height of the first support member 22 is small, the first support member 22 shields less light passing through the non-pixel region B2, so that the influence of the first support member 22 on the transmittance of the optical component region BB can be reduced.

In an embodiment of the present disclosure, referring to FIG. 2, in the optical component region BB, the first support members 22 are arranged in a density smaller than a density of the second support members 13. That is, in a unit area, the number of the first support members 22 is smaller than the number of the second support members 13. It can be understood that the number of first support members 22 in the optical component region BB is not smaller than the number of second electrodes 21. In the present disclosure, if the number of the first support members 22 is small, the first support member 22 shields less light passing through the non-pixel region B2, so that the influence of the transmittance of the first support member 22 on the optical component region BB can be reduced.

Figure 17:
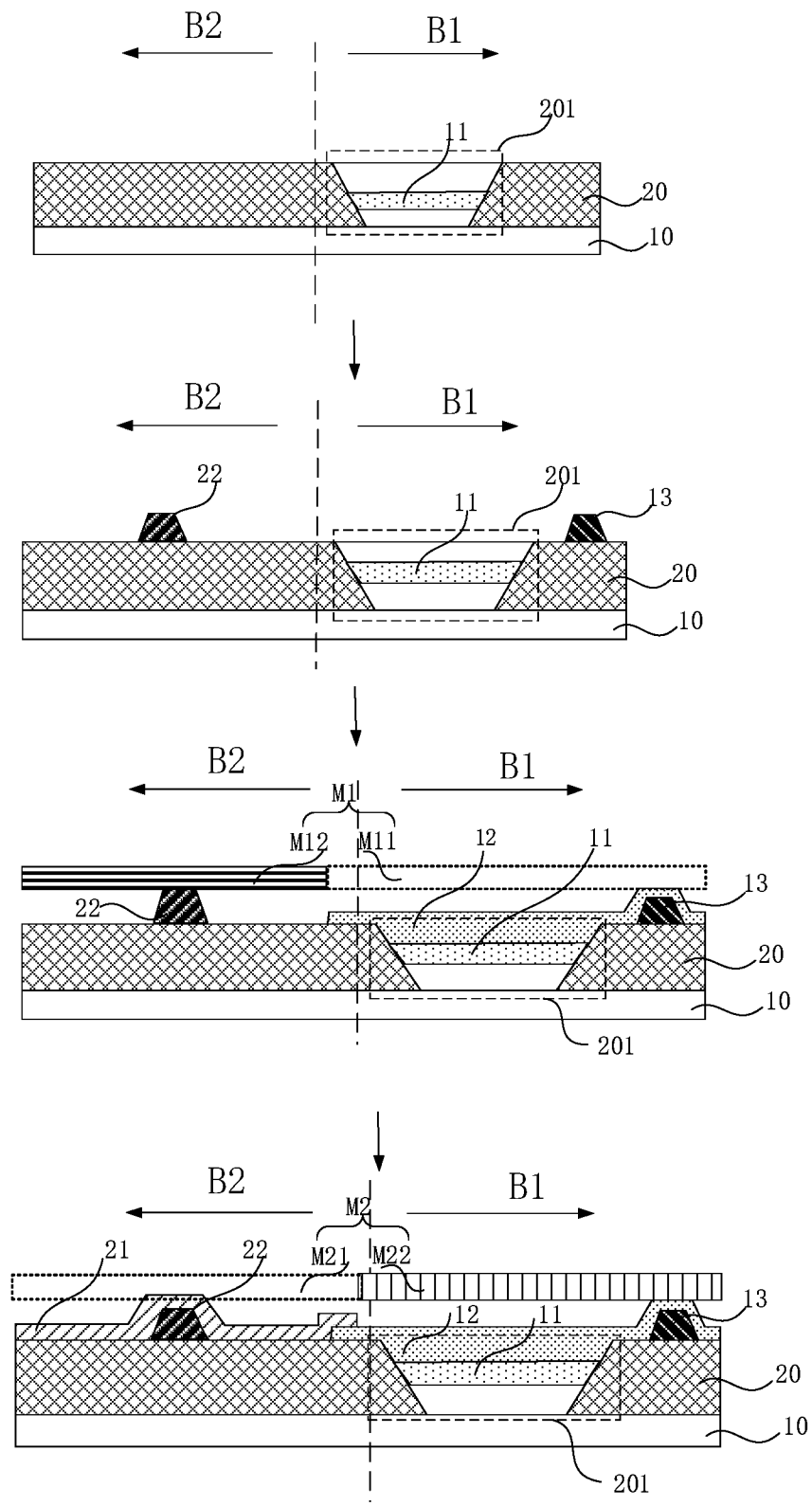
FIG. 17 is a schematic diagram showing a process for manufacturing a display panel according to an embodiment of the present disclosure.

FIG. 17 is a schematic diagram showing a process for manufacturing a display panel according to an embodiment of the present disclosure.

The present disclosure provides a method for manufacturing the display panel 01. Referring to FIG. 1, FIG. 2 and FIG. 3, the display panel 01 manufactured in the present disclosure includes a first display region AA and an optical component region BB, and the optical component region BB includes a pixel region B1 and a non-pixel region B2. The method for manufacturing the display panel 01 includes following steps.

As shown in FIG. 17, a substrate 10 is provided, and then a first light-emitting module 11 is manufactured. The first light-emitting module 11 is located at a side of the substrate 10 and is located in the pixel region B1. Then, the first support member 22 is manufactured, and the first support member 22 is located at a side of the substrate 10 and located in the non-pixel region B2. A first electrode 12 is then prepared. The first electrode 12 covers the pixel region B1 and is located at a side of the first light-emitting module 11 facing away from the substrate 10. The second electrode 21 is then prepared. The second electrode 21 is located in the non-pixel region B2 and located at a side of the first support member 22 facing away from the substrate 10.

The second electrode 21 is bridged between two adjacent first electrodes 12, and the first support member 22 overlaps with the second electrode 21 along the thickness direction of the display panel 01.

The method for manufacturing the display panel 01 according to an embodiment can includes preparing a pixel definition layer 20. The pixel definition layer 20 is located at a side of the first support member 22 close to the substrate 10, and the pixel definition layer 20 can be integrated with the first supporting member 22.

As shown in FIG. 17, the pixel definition layer 20 is prepared at a side of the substrate 10. The pixel definition layer 20 includes an opening 201 located in the pixel region B1. The first light-emitting module 11 is then prepared in the opening 201.

Figure 18:
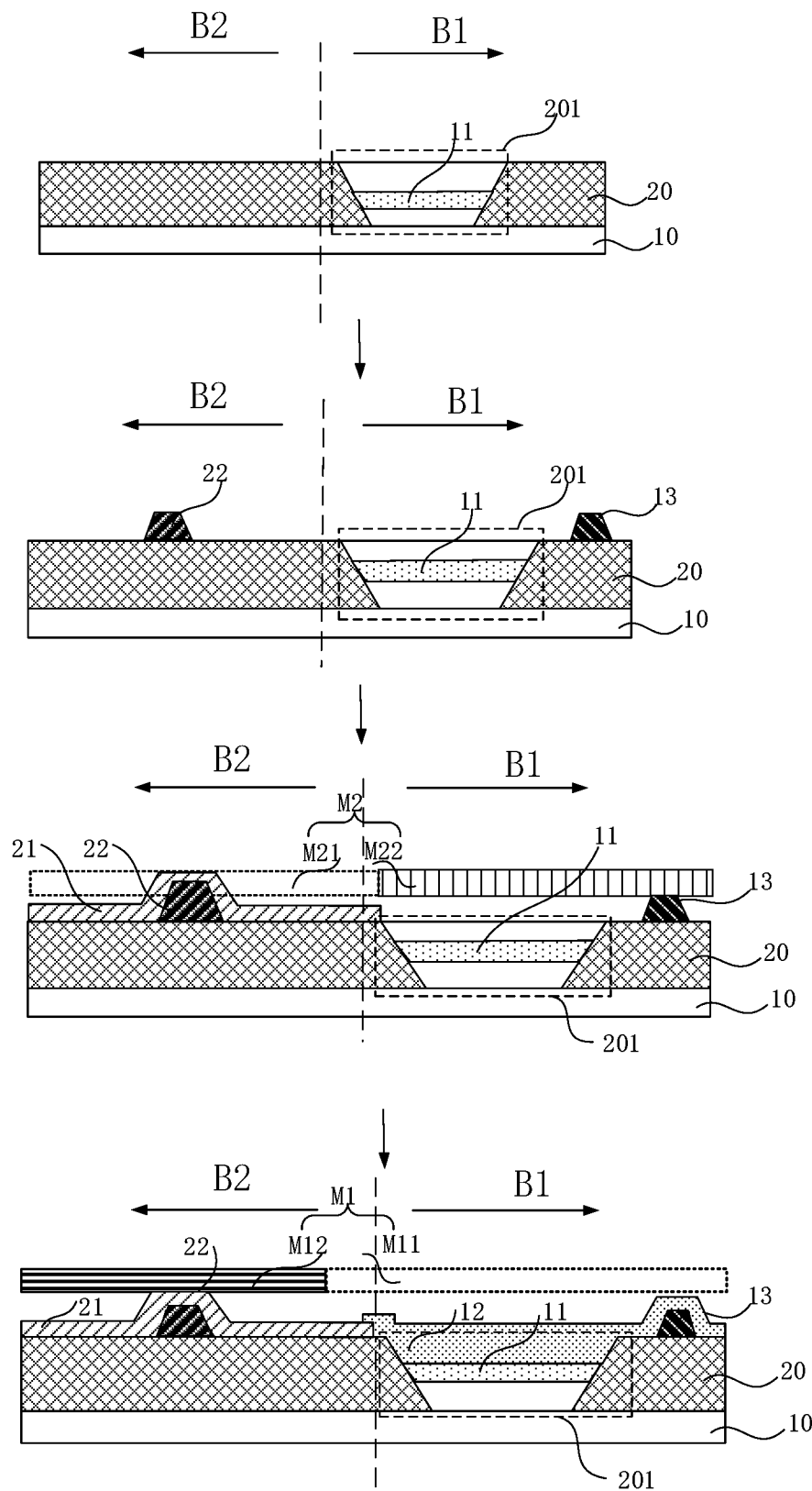
FIG. 18 is another schematic diagram showing a process for manufacturing a display panel according to an embodiment of the present disclosure.

FIG. 18 is another schematic diagram showing a process for manufacturing a display panel according to an embodiment of the present disclosure.

In the preparation sequence of the first electrode 12 and the second electrode 21 of the present disclosure, as shown in FIG. 18, the second electrode 21 can be prepared firstly, and then the first electrode 12 can be prepared, so that the second mask M2 is prevented from scratching the first electrode 12, thereby avoiding affecting the normal display of the optical component region BB.

Figure 19:
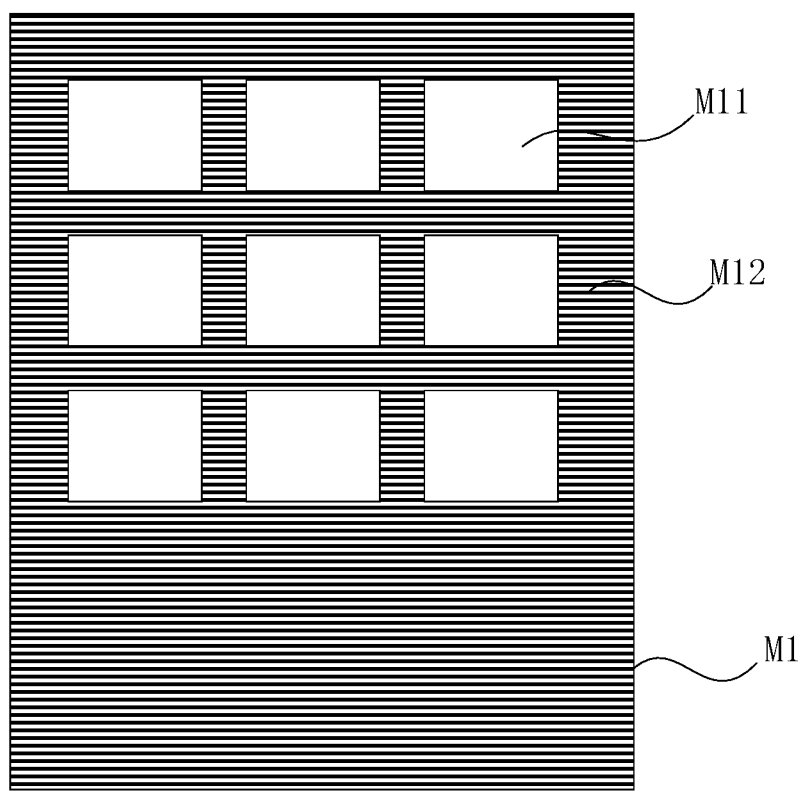
FIG. 19 is a schematic diagram showing a first mask according to an embodiment of the present disclosure.
Figure 20:
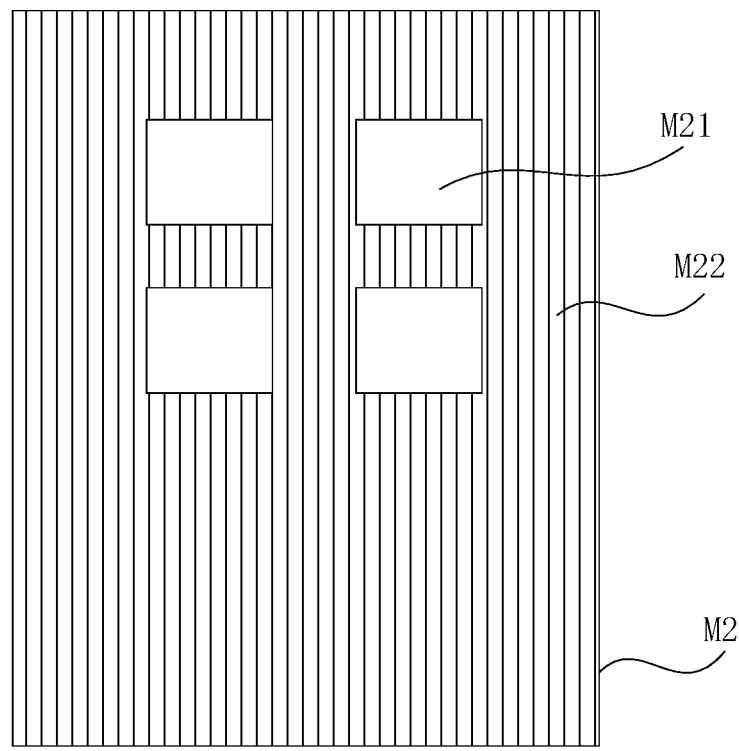
FIG. 20 is a schematic diagram showing a second mask according to an embodiment of the present disclosure.

FIG. 19 is a schematic diagram showing a first mask according to an embodiment of the present disclosure, and FIG. 20 is a schematic diagram showing a second mask according to an embodiment of the present disclosure.

In an embodiment of the present disclosure, with reference to FIG. 17 to FIG. 20, preparing the first electrode 12 includes providing a first mask M1. The first mask M1 includes a first hollow region M11 and a first border M12. The first border M12 surrounds the first hollow region M11. Then, the first mask M1 is aligned with the display panel 01, the first hollow region M11 corresponds to the pixel region B1, and the first support member 22 supports at least part of the first border M12. That is, the first mask M1 is supported by the first support member 22 to prevent the first mask from contacting the display panel 01, thereby avoiding scratching the display panel 01. Then, the first conductive material is evaporated to form the first electrode 12 in the first hollow region M11. It can be understood that the first electrode 12 covers the pixel region B1. Preparing the second electrode 21 includes: providing a second mask M2. The second mask M2 includes a second hollow region M21 and a second border M22 surrounding the second hollow region M21. Then the second mask M2 is aligned with the display panel 01, and the second hollow region M21 corresponds to the non-pixel region B2. Then the second conductive material is evaporated to form the second electrode 21 in the second hollow region M21. It can be understood that the second electrode 21 is located in the non-pixel region B2.

Referring to FIG. 17 and FIG. 18, in an embodiment of the present disclosure, the method for manufacturing the display panel 01 further includes manufacturing a second support member 13, which is located at a side of the substrate 10 and located in the pixel region B1. It can be understood that the second support member 13 is located at a side of the pixel definition layer 20 facing away from the substrate 10, and is formed into one piece with the pixel definition layer 20.

When the second mask M2 is aligned with the display panel 01, the second support member 13 supports at least part of the second border M22. That is, when the second electrode 21 is prepared, the second support member 13 is used to support the second mask M2.

The method for manufacturing the display panel 01 provided by the present disclosure can improve the transmittance of the optical component region BB, and can effectively avoid scratching the display panel 01 by the mask, thereby reducing the process difficulty and improving the yield of the display panel.

The present disclosure only illustrates a manufacturing process of the optical component region BB in the display panel 01. The cathode in the first display region AA can be prepared by using the first mask M1 while the first electrode 12 is prepared. The cathode in the first display region AA can be also prepared by using the second mask M2 while the second electrode 21 is prepared.

Figure 21:
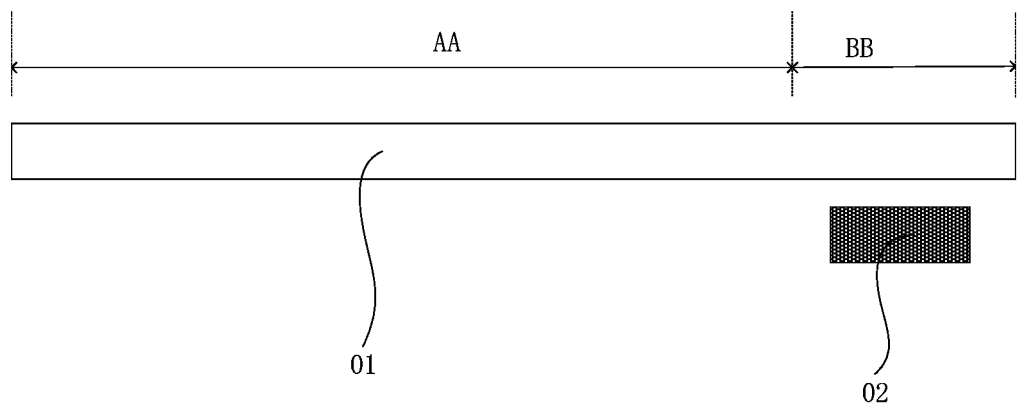
FIG. 21 is a schematic diagram showing a display apparatus according to an embodiment of the present disclosure.

FIG. 21 is a schematic diagram showing a display apparatus according to an embodiment of the present disclosure.

As shown in FIG. 21, the present disclosure provides a display apparatus 001. The display apparatus 001 includes the display panel 01 provided in any one of foregoing embodiments. The display apparatus 001 provided in the present disclosure can be a mobile phone, a tablet computer, a notebook computer and a television.

The display apparatus 001 further includes an optical function element 02 provided at a position of the display apparatus 001 corresponding to the optical component region BB of the display panel 01. That is, along the thickness direction of the display panel 01, the optical function element 02 is arranged below the optical component region BB of the display panel 01. The optical function element 02 can emit light to a side of light-emitting surface of the display panel 01 through the optical component region BB, or receive light from a side of light-emitting surface side of the display panel 01 through the optical component region BB.

The optical function element 02 is at least one of an optical fingerprint sensor, an iris recognition sensor, a camera and a flashlight.

In the present disclosure, a plurality of first electrodes 12 in the optical component region BB is electrically connected to each other through the second electrodes 21, so that the cathode in the optical component region BB corresponding to the first light-emitting module 11 is patterned, thereby improving the transmittance of the optical component region BB. It can be understood that both of the first electrode 12 and the second electrode 21 can be prepared by an evaporation process. When the cathode corresponding to the first light-emitting module 11 is patterned, two masks are used. The preparation of the first electrode 12 utilizes the first mask. The first mask includes a hollow part and a shielding part. The first electrode 12 is formed when the evaporation material is deposited in the hollow part of the first mask. That is, during the preparation process of the first electrode 12, the hollow part of the first mask corresponds to the region where the first electrode 12 is located, and the shielding part corresponds to the non-pixel region B2 where the first electrode 12 is not provided. In the preparation process of the display panel 01, when the first mask is used to prepare the first electrode 12, the first support member 22 supports the shielding part of the first mask, so that the first mask is prevented from contacting with the prepared layers (except the second electrode) of the display panel 01, thereby preventing the first mask from scratching the main functional layers (for example, the layer other than the second electrode) of the display panel 01. The preparation of the second electrode 21 uses a second mask. The second mask includes a hollow part and a shielding part. The second electrode 21 is formed when the evaporation material is deposited in the hollow part of the second mask. That is, during the preparation process of the second electrode 21, the hollow part of the second mask corresponds to the region where the second electrode 21 is located, and the shielding part corresponds to the region where the second electrode 21 is not provided. When the second mask is used to prepare the second electrode 21, the second support member 13 is used to support the shielding part of the second mask, so that the second mask is prevented from contacting the prepared layers of the display panel 01, thereby preventing the second mask from scratching the main functional layer of the display panel 01. Since the first support member 22 overlaps with the second electrode 21 along the thickness direction of the display panel 01, and the second support member 13 overlaps with the first electrode 12 along the thickness direction of the display panel 01, the mask can be well supported by the first support member 22 or the second support member 13 to prevent the mask from scratching the main functional layers of the display panel 01 in the process for patterning the cathode corresponding to the first light-emitting module 11, even if there is a misalignment between the mask and the display panel 01. Meanwhile, the second support member 13 can be provided to prevent the second mask from scratching the first electrode 12, and the first support member 22 can be provided to prevent the first mask from scratching the second electrode 21, thereby effectively improving the yield of the display panel 01.

The above are merely some embodiments of the present disclosure, which, as mentioned above, are not intended to limit the present disclosure. Within the principles of the present disclosure, any modification, equivalent substitution, improvement shall fall into the protection scope of the present disclosure.

What is claimed is:

1. A display panel, the display panel having a first display region and an optical component region, the first display region surrounding at least a part of the optical component region, the optical component region comprising a pixel region and a non-pixel region, and the display panel comprising:
   a substrate;
   at least one first light-emitting module located in the pixel region;
   first electrodes, wherein one of the first electrodes is located in the pixel region and covers the at least one first light-emitting module along a thickness direction of the display panel;
   at least one second electrode located in the non-pixel region, wherein one of the at least one second electrode is bridged between two adjacent first electrodes of the first electrodes; and
   a first support member located in the non-pixel region, wherein one second electrode of the at least one second electrode is located at a side of the first support member facing away from the substrate, and the first support member overlaps with the one second electrode along the thickness direction of the display panel; and wherein the first support member comprises a first surface and a second surface that are arranged along the thickness direction of the display panel, wherein a contour of a projection of the first surface along the thickness direction of the display panel comprises an arc segment, and/or, a contour of a projection of the second surface along the thickness direction of the display panel comprises an arc segment.

2. The display panel according to claim 1, further comprising:
a second support member located at a side of the second support member facing away from the substrate, and the second support member overlaps with the one first electrode along the thickness direction of the display panel.

3. The display panel according to claim 1, further comprising:
a pixel definition layer, wherein the first support member is located at a side of the pixel definition layer facing away from the substrate, and the first support member and the pixel definition layer are formed into one piece.

4. The display panel according to claim 1, wherein one of the at least one second electrode and one of the first electrodes adjacent to the second electrode overlap with each other along the thickness direction of the display panel in a first overlapping region, and the first overlapping region does not overlap with the at least one first light-emitting module.

5. The display panel according to claim 2, wherein a minimum distance D between a projection of the second support member along the thickness direction of the display panel and a projection of one of the at least one first light-emitting module adjacent to the second support member along the thickness direction of the display panel is greater than or equal to 3 μm.

6. The display panel according to claim 2, wherein the at least one first light-emitting module comprises a plurality of first light-emitting modules covered by one of the first electrodes, the second support member covered by the one of the first electrodes is surrounded by the plurality of first light-emitting modules along the thickness direction of the display panel.

7. The display panel according to claim 1, wherein one of the at least one second electrode has a transmittance greater than a transmittance of one of the first electrodes.

8. The display panel according to claim 1, wherein a thickness of one of the at least one second electrode along the thickness direction of the display panel is smaller than a thickness of one of the first electrodes along the thickness direction of the display panel.

9. The display panel according to claim 1, wherein the optical component region further comprises a plurality of first light-transmitting regions, and at least one of the first electrodes and one of the at least one second electrode surround one of the plurality of first light-transmitting regions.

10. The display panel according to claim 1, wherein the optical component region comprises a plurality of second light-transmitting regions, and one of the at least one second electrode overlaps with one of the plurality of second light-transmitting regions along the thickness direction of the display panel.

11. The display panel according to claim 2, wherein the second surface is located between the first surface and the substrate;
the second support member comprises a third surface and a fourth surface that are arranged in sequence along the thickness direction of the display panel, wherein the fourth surface is located between the third surface and the substrate; and
the contour of the projection of the first surface along the thickness direction of the display panel has a different shape from a contour of projection of the third surface along the thickness direction of the display panel, and/or, the contour of the projection of the second surface along the thickness direction of the display panel has a different shape from a contour of a projection of the fourth surface along the thickness direction of the display panel.

12. The display panel according to claim 2, wherein the first support member has a height H1, and the second support member has a height H2, where H1<H2.

13. The display panel according to claim 1, wherein the contour of the projection of the first surface along the thickness direction of the display panel has a different shape from the contour of the projection of the second surface along the thickness direction of the display panel.

14. The display panel according to claim 1, wherein at least two first electrodes of the first electrodes are arranged along a first direction, at least two of the first electrodes are arranged along a second direction intersecting with the first direction, and one of the at least one second electrode is bridged between two adjacent first electrodes of the at least two first electrodes arranged along the first direction.

15. A display apparatus comprising:
a display panel, wherein the display panel has a first display region and an optical component region partially surrounded by the first display region, and the optical component region comprises a pixel region and a non-pixel region; and
an optical function element provided at a position of the display apparatus corresponding to the optical component region,
wherein the display panel comprises:
a substrate;
at least one first light-emitting module located in the pixel region;
first electrodes, wherein one of the first electrodes is located in the pixel region and covers the at least one first light-emitting module along a thickness direction of the display panel;
at least one second electrode located in the non-pixel region, wherein one of the at least one second electrode is bridged between two adjacent first electrodes of the first electrodes; and
a first support member located in the non-pixel region,
wherein one second electrode of the at least one second electrode is located at a side of the first support member facing away from the substrate, and the first support member overlaps with the one second electrode along the thickness direction of the display panel; and
wherein the first support member comprises a first surface and a second surface that are arranged along the thickness direction of the display panel, wherein a contour of a projection of the first surface along the thickness direction of the display panel comprises an arc segment, and/or, a contour of a projection of the second surface along the thickness direction of the display panel comprises an arc segment.

16. The display apparatus according to claim 15, wherein the optical function element comprises at least one of an optical fingerprint sensor, an iris recognition sensor, a camera, or a flashlight.

17. A method for manufacturing a display panel, wherein the display panel comprises a first display region and an optical component region, the optical component region comprises a pixel region and a non-pixel region, and wherein the method comprises:
   providing a substrate;
   manufacturing at least one first light-emitting module, wherein the first light-emitting module is located at a side of the substrate and located in the pixel region;
   manufacturing a first support member, wherein the first support member is located at a side of the substrate and located in the non-pixel region;
   preparing first electrodes, wherein the first electrodes cover the pixel region, and one of the first electrodes is located at a side of one of the at least one first light-emitting module facing away from the substrate; and
   preparing at least one second electrode, wherein the at least one second electrode is located in the non-pixel region and located at a side of the first support member facing away from the substrate;
wherein one of the at least one second electrode is bridged between two adjacent first electrodes of the first electrodes, and the first support member overlaps with one of the at least one second electrode along a thickness direction of the display panel; and
wherein the first support member comprises a first surface and a second surface that are arranged along the thickness direction of the display panel, wherein a contour of a projection of the first surface along the thickness direction of the display panel comprises an arc segment, and/or, a contour of a projection of the second surface along the thickness direction of the display panel comprises an arc segment.

18. The method for manufacturing the display panel according to claim 17, wherein said preparing the first electrodes comprises:
   providing a first mask, wherein the first mask comprises a first hollow region and a first border that surrounds the first hollow region;
   aligning the first mask with the display panel such that the first hollow region corresponds to the pixel region, and the first support member supports at least a part of the first border; and
   evaporating a first conductive material to form the first electrodes in the first hollow region; and
wherein said preparing the at least one second electrode comprises:
   providing a second mask, wherein the second mask comprises a second hollow region and a second border that surrounds the second hollow region;
   aligning the second mask with the display panel such that the second hollow region corresponds to the non-pixel region; and
   evaporating a second conductive material to form the at least one second electrode in the second hollow region.

19. The method for manufacturing the display panel according to claim 18, further comprising:
   manufacturing a second support member, wherein the second support member is located at a side of the substrate and in the pixel region,
   wherein the second support member supports at least a part of the second border when the second mask is aligned with the display panel.

* * * * *